United States Patent
Colombo et al.

(10) Patent No.: US 7,601,578 B2
(45) Date of Patent: *Oct. 13, 2009

(54) DEFECT CONTROL IN GATE DIELECTRICS

(75) Inventors: Luigi Colombo, Dallas, TX (US); James J. Chambers, Dallas, TX (US); Mark R. Visokay, Richardson, TX (US); Antonio Luis Pacheco Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/924,132

(22) Filed: Oct. 25, 2007

(65) Prior Publication Data

US 2008/0057739 A1    Mar. 6, 2008

Related U.S. Application Data

(63) Continuation of application No. 10/739,617, filed on Dec. 18, 2003, now Pat. No. 7,351,626.

(51) Int. Cl.
*H01L 21/336* (2006.01)
*H01L 21/8234* (2006.01)

(52) U.S. Cl. .............. 438/197; 438/216; 438/287; 438/591

(58) Field of Classification Search .............. None
See application file for complete search history.

(56) References Cited

U.S. PATENT DOCUMENTS

| 5,786,277 | A | 7/1998 | Yamamoto |
| 6,013,553 | A | 1/2000 | Wallace et al. |
| 6,060,755 | A | 5/2000 | Ma et al. |
| 6,162,744 | A | 12/2000 | Al-Shareef et al. |
| 6,204,203 | B1* | 3/2001 | Narwankar et al. ......... 438/785 |
| 6,413,386 | B1* | 7/2002 | Callegari et al. ....... 204/192.23 |
| 6,544,906 | B2 | 4/2003 | Rotondaro et al. |
| 6,689,675 | B1 | 2/2004 | Parker et al. |
| 7,135,361 | B2* | 11/2006 | Visokay et al. .............. 438/197 |
| 7,351,626 | B2* | 4/2008 | Colombo et al. ............ 438/197 |

* cited by examiner

*Primary Examiner*—Zandra Smith
*Assistant Examiner*—Khanh B Duong
(74) *Attorney, Agent, or Firm*—Jacqueline J. Garner; Wade J. Brady, III; Frederick J. Telecky, Jr.

(57) ABSTRACT

A method for improving high-κ gate dielectric film (104) properties. The high-κ film (104) is subjected to a two step anneal sequence. The first anneal is performed in a reducing ambient (106) with low partial pressure of oxidizer to promote film relaxation and increase by-product diffusion and desorption. The second anneal is performed in an oxidizing ambient (108) with a low partial pressure of reducer to remove defects and impurities.

16 Claims, 1 Drawing Sheet

DEFECT CONTROL IN GATE DIELECTRICS

This is a continuation application of Ser. No. 10/739,617 filed Dec. 18, 2003.

CROSS-REFERENCE TO RELATED APPLICATIONS

The following co-pending application are related and hereby incorporated by reference

| Ser. No. | Filing Date | Inventor |
| --- | --- | --- |
| 09/885,744 | Jun. 20, 2001 | Niimi et al. |
| 10/185,326 | Jun. 28, 2002 | Visokay et al. |

FIELD OF THE INVENTION

The invention is generally related to the field of forming high dielectric constant (high-κ) films in semiconductor devices and more specifically to forming high-κ gate dielectrics.

BACKGROUND OF THE INVENTION

As semiconductor devices have scaled to smaller and smaller dimensions, the gate dielectric thickness has continued to shrink. Although further scaling of devices is still possible, scaling of the gate dielectric thickness has almost reached its practical limit with the conventional gate dielectric material, silicon dioxide. Further scaling of silicon dioxide gate dielectric thickness will involve a host of problems: extremely thin layers allow for large leakage currents due to direct tunneling through the oxide. Because such layers are formed literally by a few monolayers of atoms, exacting process control is required to repeatably produce such layers. Uniformity of coverage is also critical because device parameters may change dramatically based on the presence or absence of even a single monolayer of dielectric material. Finally, such thin layers form poor diffusion barriers to impurities.

Realizing the limitations of silicon dioxide, researchers have searched for alternative dielectric materials that are thicker than silicon dioxide and yet still produce the same field effect performance. This performance is often expressed as "equivalent oxide thickness." Although the alternative material layer may be physically thick, it has the equivalent electrical effect of a much thinner layer of silicon dioxide (commonly called simply "oxide"). In the most recent technology node devices silicon dioxide has been replaced with a SiON. However, even SiON will have to be replaced by high-κ dielectrics to reduce leakage as the equivalent oxide thickness is reduced. Some films currently being investigated include deposited oxides, nitrides, and oxynitrides such as $HfO_x$, HfSiO, HfSiON, AlON, and AlZrO. Manufacturable processes for incorporating these materials are needed.

ADVANTAGES OF THE INVENTION

An advantage of the invention is providing an anneal chemistry that reduces point defects and impurities in a gate dielectric film.

This and other advantages will be apparent to those of ordinary skill in the art having reference to the specification in conjunction with the drawings.

DETAILED DESCRIPTION OF THE EMBODIMENTS

High-κ dielectric films currently being considered to replace SiON are typically deposited oxides or nitrides such as HfSiO, HfSiON, AlON, or AlZrO. Deposition techniques such as CVD (chemical vapor deposition), PVD (physical vapor deposition), ALD (atomic layer deposition), and MBE (molecular beam epitaxy) may be used to form these films. The macroscopic composition (e.g., metal:Si ratio) of the films is reasonably easy to control during fabrication, but the defect content (e.g., point defects like oxygen vacancies) is usually not. Additionally, depending upon the deposition type and precursor materials used, unwanted species such as —C, —CH, —OH, —COOH, Cl, etc. can be incorporated into the film. Both point defects as well as unwanted impurities are detrimental to the electrical properties of the dielectric film. Finally, the films may not be fully densified.

Because of the presence of defects after deposition, it is generally desirable to use an oxidizing ambient anneal in order to improve the film properties after deposition. This anneal can have the effects of reducing defects and ensuring that the film has the correct amount of oxygen. Additionally, for films deposited using metalorganic precursors, this oxidation anneal can help remove carbon and/or OH from the film. This effect is expected to result in reduced leakage currents and possibly improved interface (silicon/high-κ) characteristics. However, this oxidizing anneal can also cause the growth of a lower dielectric-constant layer (primarily made up of $SiO_2$) between the high-κ gate material and the Si substrate. Low temperature oxidizing anneals avoid increases in the EOT (effective oxide thickness) but do not allow for densification. Non-oxidizing (e.g., Ar, He or $N_2$) high temperature anneals allow for densification but typically do not heal defects, or might even be detrimental.

One embodiment of the current invention provides a two-step anneal. The first step is an anneal in a reducing ambient with a low partial pressure of oxidizer. The second step consists of an anneal in an oxidizing ambient with a low partial pressure of a reducing gas. The first anneal provides a slightly oxidizing anneal to satisfy bonds as well as an increase of by-product diffusion and desorption. The first anneal may occur at a higher temperature. The second anneal provides the ability to create active species (i.e., O, O radicals, OH, etc) to efficiently react with and satisfy all bonds as well as remove the unwanted impurities.

Figure 1:
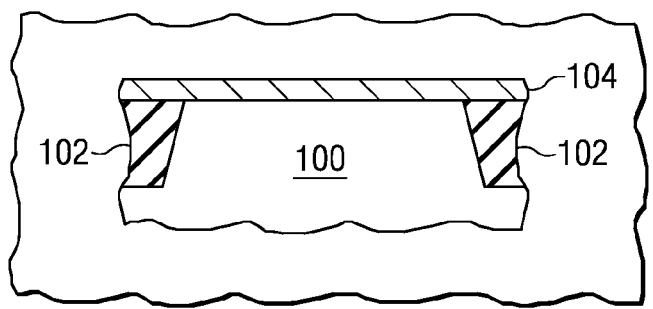
FIGS. 1-4 are cross-sectional diagrams of a high-κ gate dielectric formed according to an embodiment of the invention at various stages of fabrication.

The invention will now be described in conjunction with a method for forming a MOSFET transistor. Referring to FIG. 1, a semiconductor body 100 is processed through the formation of isolation structures 102. A high-κ gate dielectric 104 is formed at the surface of semiconductor body 104. High-κ dielectric 104 may, for example, comprise a deposited metal-nitride, metal-oxide or metal-oxynitride such as MN, MO, MON, MSiO, MSiN, MSiON, MAlO, MAlN, MAlON, MAlSiO, MAlSiN, or MAlSiON, where M is Zr, Hf, La, Y, Gd, Eu, Pr, or Ce. U.S. Pat. No. 6,291,866 issued Sep. 18, 2001, U.S. Pat. No. 6,291,867 issued Sep. 18, 2001, U.S. Pat. No. 6,020,243 issued Feb. 1, 2000, and U.S. Pat. No. 6,013,553 issued Jan. 11, 2000, assigned to Texas Instruments Incorporated and incorporated herein by reference, describe processes for forming Zr or Hf oxynitride and silicon-oxynitride gate dielectrics.

Figure 2:
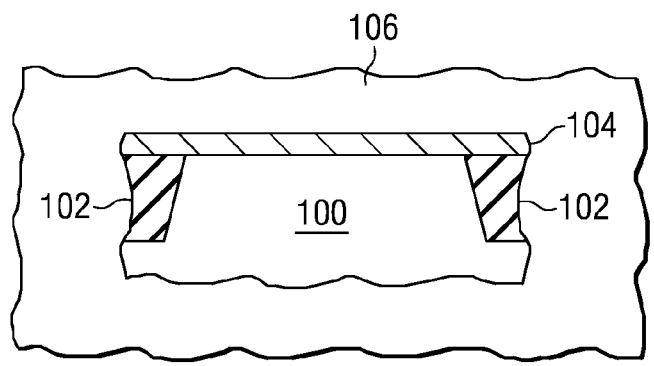

Referring to FIG. 2, high-κ gate dielectric 104 is subjected to a first anneal. The first anneal occurs in a reducing ambient 106 with a small partial pressure of oxidizer. Small partial pressure in this context refers to a partial pressure of 0.01 to 100 Torr. As an example, the oxidizer percentage in the ambient is less than 20% and preferably less than 5%. The ambient 106 may, for example, comprise $H_2/O_2$, $H_2/N_2O$, $H_2/NO$, or H2. Other suitable reducers include hydrocarbons such as $CH_4$, $C_2H_6$, $C_2H_2$, etc. and silane. The first anneal may occur at a higher temperature without increasing the effective EOT because only a small amount of oxidizer is used. For example, the temperature may be in the range of 500° C. to 1100° C. and the pressure may be in the range of 0.01-760 Torr. As an example, the first anneal may be performed at 1000° C. in an $H_2$ ambient with a small amount of $O_2$ (i.e., less than 20% and preferably less than 5%) for on the order of 60 sec. The purpose of the first anneal is to promote film relaxation and increase by-product diffusion and desorption. If desired, the first anneal may be performed with 100% reducer gas and no oxidizer.

Figure 3:
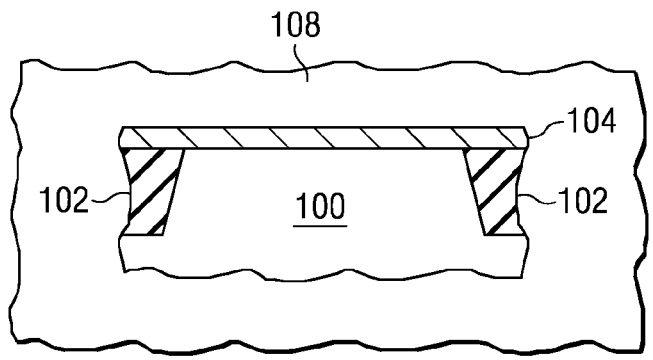

Referring to FIG. 3, high-κ dielectric 104 is subjected to a second anneal. The second anneal occurs in an oxidizing ambient 108 with a low partial pressure of the reducer. Low partial pressure in this context refers to a partial pressure of 0.01 to 100 Torr. For example, the reducer percentage in the ambient is less than 10% and preferably less than 1%. The ambient 108 may, for example, comprise $H_2/O_2$, $H_2/N_2O$, $H_2/NO$, $O_2$, $N_2O$, or NO. Other suitable reducers include hydrocarbons such as $CH_4$, $C_2H_6$, $C_2H_2$, etc. and silane. The same gases may be used for the first and second anneal, if desired. However, the concentration of gases differs: low oxidizer-high reducer in the first anneal and high oxidizer-low reducer in the second anneal. The second anneal should occur at a lower temperature so as to not significantly increase the EOT. For example, a temperature on the order of 700° C. (Range: 500° C. to 1100° C.) may be used. The pressure may be in the range of 0.01-760 Torr. The duration of the anneal may be on the order of 60 sec. The purpose of the second anneal is to create active species (i.e., O, O radicals, OH, etc) to efficiently remove defects and impurities. If desired, the second anneal may be performed in 100% oxidizer and no reducer.

The first and second anneals may be separate processes or run as two steps within one recipe. For example, depending on the anneal tool configuration, this dual anneal sequence could be done in a single processing run with a multistep annealing recipe. Although it is more desirable to have the oxidizing anneal after the reducing anneal, the order of the anneal could be reversed.

The resulting high-κ gate dielectric 104 has the advantages of low fixed charge, low charge trapping, low $D_{it}$, and as a result of the low charge density of the high-κ film mobility degradation that may result from remote charge scattering is minimized. In addition, low point defect density results in low diffusion of dopants or metal from the gate electrode through the gate dielectric. Dopant incorporation into the gate dielectric from the channel, and source and drain regions may also be minimized. The reduction of point defects in the films will effectively create a denser film that will minimize the incorporation of other species in the vicinity of the gate dielectric that could potentially impact the reliability characteristics of the dielectric.

Figure 4:
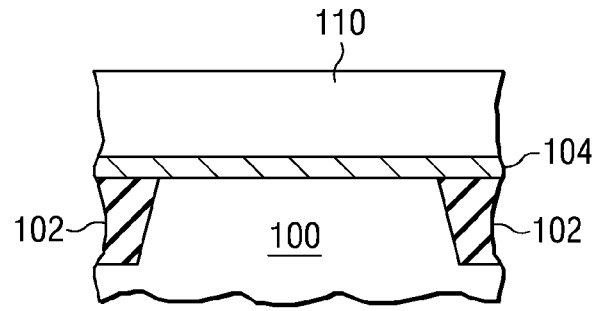

After the first and second anneals, a gate electrode material 110 is deposited over the high-κ gate dielectric 104, as shown in FIG. 4. Processing then continues by patterning and etching to form the gate electrode, forming the source/drain junction regions, forming interconnects and packaging the device.

In another embodiment of the invention, the first and second anneals are replaced with a single anneal performed in an ambient comprising a reducer and an oxidizer. The partial pressures of the reducer and the oxidizer in this anneal are optimized to enable a high temperature anneal that does not increase the amount of $SiO_2$ formation at the interface, but does densify and reduce defects in the dielectric.

While this invention has been described with reference to illustrative embodiments, this description is not intended to be construed in a limiting sense. For example, the anneals described above may be performed on gate dielectrics other than high-κ gate dielectrics such as silicon-dioxide and silicon-oxynitride. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method for fabricating an integrated circuit, comprising the steps of:
   depositing a high-κ gate dielectric over a surface of a semiconductor body;
   performing a first anneal in a reducing ambient, wherein said reducing ambient comprises an oxidizer at a small partial pressure and a reducer selected from the group consisting of $H_2$, hydrocarbons, and silanes; and
   performing a second anneal in an oxidizing ambient.

2. The method of claim 1, wherein said oxidizing ambient comprises a low partial pressure of reducer.

3. The method of claim 2, wherein a percentage of said reducer in said oxidizing ambient is less than 10%.

4. The method of claim 2, wherein a percentage of said reducer in said oxidizing ambient is less than 1%.

5. The method of claim 1, wherein said high-κ gate dielectric is comprises a metal oxide.

6. The method of claim 1, wherein said high-κ gate dielectric comprises a metal oxynitride.

7. The method of claim 1, wherein said high-κ gate dielectric comprises a metal-silicon-oxide.

8. The method of claim 1, wherein said high-κ gate dielectric comprises a metal-silicon-oxynitride.

9. The method of claim 1, wherein said high-κ gate dielectric comprises a material selected from the group consisting of MN, MO, MON, MSiO, MSiN, MSiON, MAlO, MAlN, MAlON, MAlSiO, MAlSiN, or MAlSiON, where M is Zr, Hf, La, Y, Gd, Eu, Pr, or Ce.

10. The method of claim 1, wherein a percentage of said oxidizer in said reducing ambient is less than 20%.

11. The method of claim 1, wherein a percentage of said oxidizer in said reducing ambient is less than 5%.

12. The method of claim 1, wherein said first anneal is performed prior to said second anneal.

13. The method of claim 1, wherein said first anneal is performed at a higher temperature than said second anneal.

14. The method of claim 1, wherein said small partial pressure of oxidizer is between 0.01 and 100 Torr.

15. A method for fabricating an integrated circuit, comprising the steps of:
   depositing a high-κ gate dielectric over a surface of a semiconductor body;
   performing a first anneal in a reducing ambient, wherein said reducing ambient comprises an oxidizer at a small partial pressure, and wherein said reducing ambient with small partial pressure of oxidizer comprises an oxidizer selected from the group consisting of $O_2$, $N_2$ and NO and a reducer selected from the group consisting of $H_2$, hydrocarbons, and silanes; and performing a second anneal in an oxidizing ambient.

16. The method of claim 15, wherein said small partial pressure of oxidizer is between 0.01 and 100 Torr.

* * * * *